United States Patent [19]

Chen et al.

[11] Patent Number: 4,888,820
[45] Date of Patent: Dec. 19, 1989

[54] STACKED INSULATING FILM INCLUDING YTTRIUM OXIDE

[75] Inventors: Ih-Chin Chen, Richardson; Bing W. Shen, Richardson; James G. Bohlman, Forney; Hun-Lian Tsai, Dallas, all of Tex.

[73] Assignee: Texas Instruments Incorporated, Dallas, Tex.

[21] Appl. No.: 280,778

[22] Filed: Dec. 6, 1988

[51] Int. Cl.[4] .................. H01G 4/06; H01G 3/075; H01L 23/93; H01L 21/70

[52] U.S. Cl. ................... 361/313; 29/25.42; 357/23.6; 357/51; 437/52

[58] Field of Search .............. 29/25.42; 220/453; 357/25, 71, 51, 23.6; 313/503, 509; 219/525; 252/62.3 BT; 429/66; 264/65; 361/311–313; 437/52

[56] References Cited
U.S. PATENT DOCUMENTS

| | | | |
|---|---|---|---|
| 3,819,990 | 6/1974 | Hayashi et al. | 29/25.42 X |
| 3,962,713 | 6/1976 | Kendall et al. | 357/51 X |
| 4,734,618 | 3/1988 | Matsudaira et al. | 313/509 |
| 4,742,018 | 5/1988 | Kimura et al. | 357/23.6 X |
| 4,761,678 | 8/1988 | Goto | 357/51 X |

OTHER PUBLICATIONS

Gurvitch et al., "Study of Thermally Oxidized Yttrium Films on Silicon", Appl. Phys, Lett. 51(12), Sep. 21, 1987, pp. 919–921.

Manchanda et al., "Yttrium Oxide/Silicon Dioxide: A New Dielectric Structure for VLSI/ULSI Circuits", IEEE Electron Device Letters, vol. 9, No. 4, Apr., 1988; pp. 180–185.

*Primary Examiner*—Donald A. Griffin
*Attorney, Agent, or Firm*—Rodney M. Anderson; Melvin Sharp

[57] ABSTRACT

A capacitor, and a method for making the same, are disclosed, wherein one plate of the capacitor comprises silicon. The dielectric material of the capacitor includes a silicon nitride layer disposed adjacent the silicon plate, and a layer of yttrium oxide disposed thereover. The second plate of the capacitor is formed over the yttrium oxide layer. The silicon nitride provides a barrier to the diffusion of silicon into the yttrium oxide film if the structure is heated, providing for a high dielectric constant capacitor dielectric which has improved leakage characteristics.

23 Claims, 5 Drawing Sheets

STACKED INSULATING FILM INCLUDING YTTRIUM OXIDE

This application is in the field of integrated circuits, and is particularly directed to dielectric materials for use in capacitors in integrated circuits.

BACKGROUND OF THE INVENTION

The special relationship of silicon to its thermal oxide SiO2 is responsible, to a large degree, for the successful manufacture and reliability of modern high density integrated circuits. This is especially true in the field of dynamic random access memories (dRAMs), where digital data is memorized in the form of stored charge across a capacitor. Thermal silicon dioxide serves as the conventional dielectric material for silicon to silicon capacitors, due to its low leakage current density, high electric field breakdown strength, high thermal stability, and low failure rate due to time dependent dielectric breakdown.

As integrated circuits, especially dRAMs, become more dense over time, the surface area available for the fabrication of an individual capacitor must necessarily decrease. In the field of dRAMs, however, the trend toward smaller capacitors runs counter to the desire to have the storage cell capacitance be as large as possible. Indeed, it is preferable that the storage cell capacitance for a dRAM have a value of at least 50 fF to keep the soft error rate due to alpha particle bombardment remain at an acceptably low level. Since the available surface area for the capacitor is decreasing with new generation technology, either the dielectric thickness or the dielectric constant must increase in order to maintain the storage cell capacitance at the desired value. With silicon dioxide as the capacitor dielectric, as the dielectric thickness is reduced, the extent of pinhole defects in the film increases, and the voltage of the onset of Fowler-Nordheim tunneling decreases. These factors point out the need for a dielectric material with a relative dielectric constant greater than that of silicon dioxide, so that the film thickness can remain at a manufacturable and reliable level, and so that the desired capacitance value can be attained in the reduced silicon surface area available.

Prior work has been directed to the use of materials other than silicon oxide, or in addition to silicon dioxide, as capacitor dielectrics in order to increase the relative dielectric constant for a capacitor. Examples of the use of sandwich films of silicon nitride with silicon dioxide are described in U.S. Pat. No. 4,577,390 issued Mar. 25, 1986 (oxide/nitride/oxidized nitride stacked film), and in copending application Ser. No. 174,751 filed Mar. 29, 1988 (nitride/oxide/nitride), both assigned to Texas Instruments Incorporated. Each of these examples provide for a dielectric film which has a higher effective dielectric constant than a film solely of silicon dioxide.

Materials other than silicon compounds have also been considered for use as a dielectric material. Yttrium oxide ($Y_2O_3$) has been found to be a particularly attractive material, due to its high relative dielectric constant (13 to 16, as compared to 4 for silicon dioxide), as well as its relatively high electric field breakdown value (on the order of 4 MV/cm). The use of yttruim oxide as a dielectric material overlying silicon, and overlying a silicon dioxide film overlying silicon, is described by Gurvitch, Manchanda and Gibson in "Study of thermally oxidized yttrium films on silicon," *Applied Physics Letters*, 51(12) (September 1987), pp. 919–921, and by Manchanda and Gurvitch in "Yttrium Oxide/Silicon Dioxide: A New Dielectric Structure for VLSI/ULSI Circuits," IEEE Electron Device Letters, Vol. 9, No. 4 (April 1988), pp. 180–182. Where yttrium oxide is formed either over silicon, or over silicon dioxide over silicon, this work indicates that if the ambient temperature of the structure after formation of the yttrium oxide exceeds 500 degrees Celsius, silicon may react with the yttrium in the yttrium oxide.

The reaction of silicon with the yttrium in the dielectric has been found to be detrimental to the quality of the yttrium oxide dielectric film. Referring to FIGS. 1a and 1b, the electrical behavior of a capacitor having a dielectric of yttrium oxide formed directly over silicon is illustrated. The capacitor dielectric for which the results are shown in FIGS. 1a and 1b was formed by the sputtering of yttrium metal directly onto silicon, followed by rapid thermal oxidation to form the yttrium oxide, and followed by rapid thermal annealing at various temperatures. The upper plate of the capacitor is aluminum. FIG. 1a shows the plate to plate leakage current for positive bias polarity (upper plate to lower plate) for the various temperatures, and FIG. 1b shows the plate to plate leakage current for negative bias polarity for the anneal temperatures. It should be noted that the horizontal axis is defined as the "effective" electric field $E_{eff}$ in MV/cm so that the performance of the yttrium oxide can be compared to that of silicon dioxide. The effective electric field is defined as the applied electric field times the ratio of the dielectric constant of the particular material under test to that of silicon dioxide. The degradation in leakage with increasing anneal temperature is observed for positive polarity but not for negative polarity, indicating the presence of silicon in the capacitor dielectric, diffusing upwardly from the lower plate. The Gurvitch et al. paper referred to hereinabove clearly shows the presence of silicon in the yttrium oxide film when formed over a layer of silicon dioxide. This degradation with the temperature to which the dielectric film is exposed after its formation provides a serious limitation in the use of yttrium oxide in integrated circuits, as many processing steps at a temperature exceeding 400 degrees Celsius are necessary in the fabrication of a typical dRAM circuit after the formation of the storage capacitor. If yttrium oxide is used as the capacitor dielectric according to these prior configurations, either an increase in leakage due to such temperature exposure must be tolerated, or the capacitor must be formed at a late point in the manufacturing process. Neither alternative is desirable.

It is therefore an object of this invention to provide a method for forming an integrated circuit capacitor including yttrium oxide which provides improved thermal stability.

It is a further object of this invention to provide an integrated circuit capacitor using yttrium oxide in the dielectric which has improved manufacturing compatibility with modern processes.

Other objects and advantages of the invention will become apparent to those of ordinary skill in the art having reference to this specification in conjunction with the drawings.

SUMMARY OF THE INVENTION

The invention may be incorporated into a capacitor having a silicon lower plate. The capacitor dielectric consists of a layer of silicon nitride underlying a layer of yttrium oxide. A metal or polysilicon upper plate may be provided. The silicon nitride prevents diffusion of silicon into the yttrium oxide, thereby providing improved leakage characteristics and improved thermal stability.

DETAILED DESCRIPTION OF THE PREFERRED EMBODIMENTS

Figure 2:
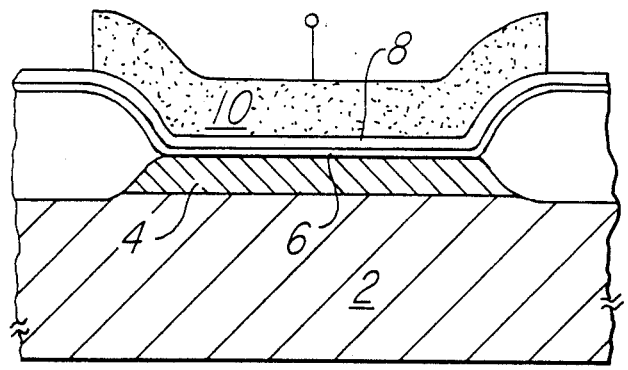
FIG. 2 is a cross-sectional diagram of a capacitor formed according to the invention.

Referring to FIG. 2, a capacitor according to the invention is illustrated in cross-section. In this embodiment, the lower plate consists of a region 4 of single-crystal silicon substrate 2, as in conventional capacitors. This region may be heavily doped so as to substantially be a conductor, or doped in another manner as desired, for example to form a high-C capacitor such as described in U.S. Pat. No. 4,164,751 issued Aug. 14, 1979 and assigned to Texas Instruments Incorporated. It should be noted that the instant invention is applicable to a capacitor where the lower plate is formed of a polysilicon layer overlying an insulator such as described in U.S. Pat. No. 4,577,390 issued Mar. 25, 1986, and in U.S. Pat. No. 4,613,956 issued Sept. 23, 1986, both assigned to Texas Instruments Incorporated. A layer of silicon nitride 6 is disposed over region 4. An exemplary thickness for silicon nitride layer 6 is on the order of 10 nm. Overlying silicon nitride layer 6 is a layer of yttrium oxide 8. According to this embodiment, an exemplary thickness of yttrium oxide layer 8 is on the order of 15 nm. Overlying yttrium oxide layer 8 is the upper plate of the capacitor, formed of a layer 10 of a conductor. In this embodiment the layer 10 is formed of aluminum. Connections to the upper and lower plates of the capacitor are formed according to conventional techniques.

The embodiment of the capacitor of FIG. 2 according to the invention may be formed by the method described hereinbelow. The lower plate of the capacitor is formed by way of forming moat regions into which the diffusions are to be formed, such moat regions isolated from one another by way of local oxidation of silicon (LOCOS) or any other conventional isolation technique. The desired doping for region 4 is accomplished by way of ion implantation and a subsequent drive-in anneal, as is well known in the art. Silicon nitride layer 6 is then deposited over region 4 by any conventional manner such as low pressure chemical vapor deposition, to the desired thickness. As mentioned above, an exemplary thickness is on the order of 10 nm.

Subsequent to the deposition of nitride layer 6, a layer of yttrium metal is deposited thereover, for example by conventional sputtering techniques to a thickness on the order of 15 nm. In the preferred embodiment, the deposition of the yttrium metal is followed by a rapid thermal anneal in an oxidizing ambient. An example of such an oxidation is subjection of the structure to a rapid anneal of 30 seconds at a temperature of 500 degrees Celsius in an oxygen ambient, forming yttrium oxide layer 8 of FIG. 2 having a thickness on the order of 15 nm. An example of a rapid thermal reactor in which this oxidation can be performed is an ALP 6000 reactor manufactured by Peak Systems, Inc. The structure is then subjected to a rapid thermal anneal in an inert ambient, such as an anneal at 700 degrees Celsius for one minute in argon. The upper plate is then formed by way of conventional sputter deposition of aluminum, doped with conventional dopants such as copper or silicon if desired, forming layer 10. Patterning and etching of aluminum layer 10 is then performed using conventional photolithography and etching techniques, to form the desired geometry of the upper plate and connections thereto. Other steps may be inserted into this process, such as the formation of other dielectric films and the etching of contact holes so that aluminum layer may make contact to diffusion regions such as region 4 elsewhere on the wafer, as desired. The capacitor of FIG. 2 results from this method.

Figure 3:
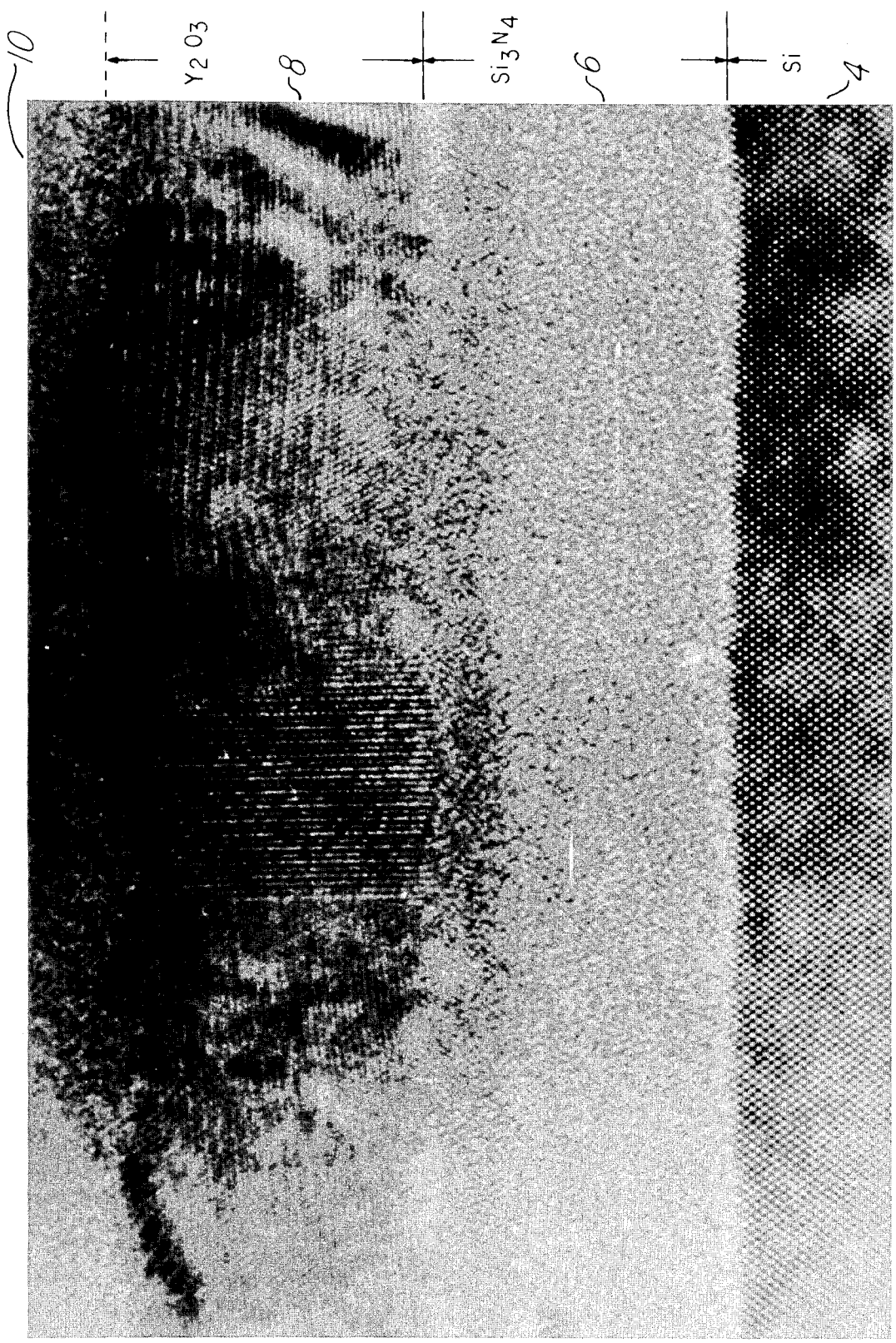
FIG. 3 is a TEM microphotograph of a capacitor formed according to a first embodiment of the invention.

FIG. 3 is a TEM microphotograph of a capacitor formed according to the invention, illustrating the relationship of the layers to one another, and indicating the well-defined interface between yttrium oxide layer 8 and silicon nitride layer 6, indicating the absence of silicon intermixing in the yttrium oxide layer 8 due to the barrier effect of the silicon nitride layer 6.

Figure 1B:
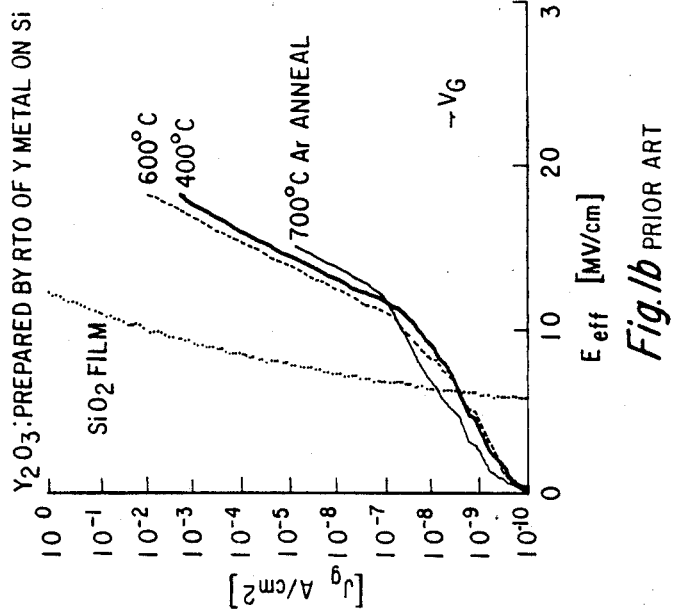
FIGS. 1a and 1b illustrate the leakage characteristics of a capacitor having yttrium oxide as the dielectric formed over silicon, as according to the prior art.
Figure 1A:
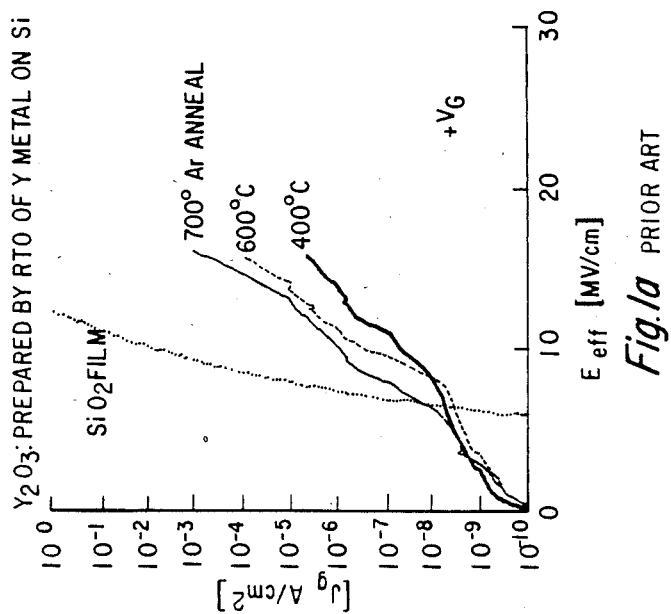
Figures 4A, 4B:
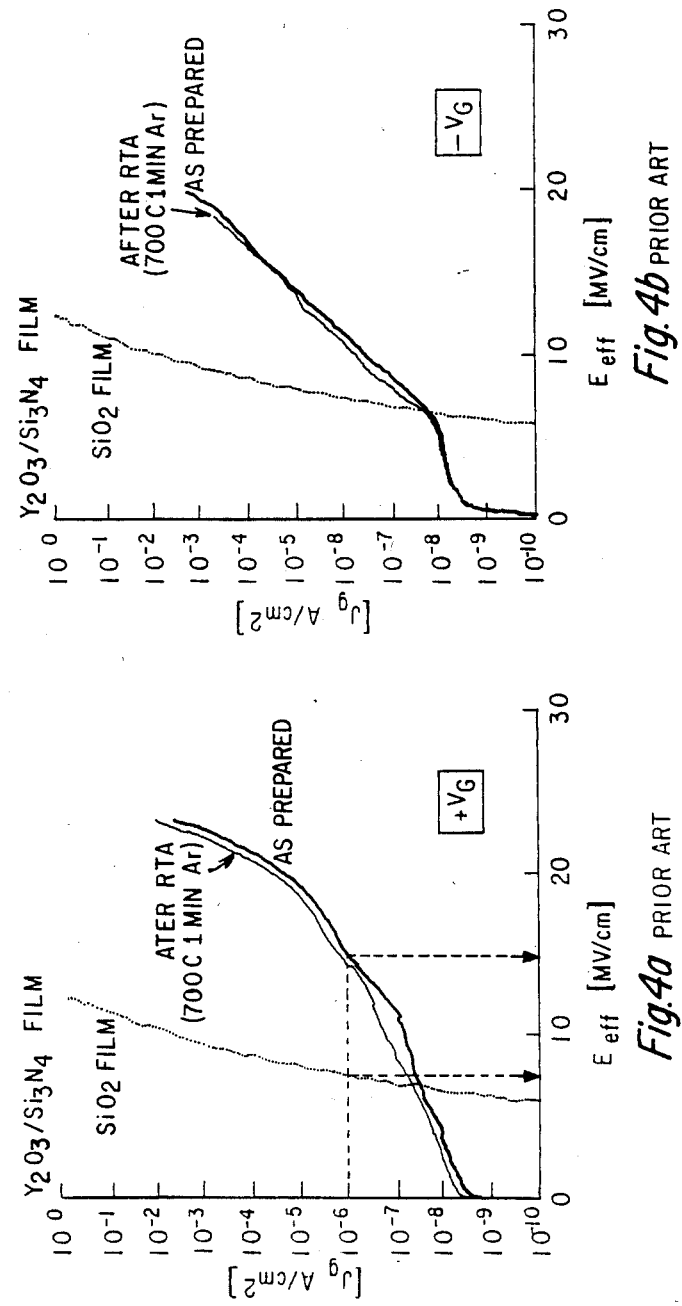
FIGS. 4a and 4b illustrate the leakage characteristics of a capacitor formed according to the invention.

Referring now to FIGS. 4a and 4b, the electrical characteristics of the capacitor of FIG. 2 described hereinabove are shown. The axes of FIGS. 4a and 4b are similar as the axes for FIGS. 1a and 1b discussed hereinabove. Referring to FIG. 4a, it is observed that there is reduced degradation of the leakage characteristic after the argon rapid thermal anneal as compared to the prior structure shown in FIG. 1a, for positive bias polarity. FIG. 4b illustrates that good thermal stability for this anneal is also observed in the reverse polarity case. The improved thermal stability of the capacitor characteristics is attributed at this time to the barrier presented by silicon nitride layer 6 to the diffusion of silicon atoms from region 4 of substrate 2 into yttrium oxide layer 8; as described above, the absence of such diffusion is also indicated by the microphotograph of FIG. 3. A capacitor formed according to the invention thus shows improved thermal stability over the prior method described above.

It should further be noted that FIGS. 4a and 4b show the leakage characteristic of a silicon dioxide film. This is due to the higher relative dielectric constant of the yttrium oxide layer 8, as well as the silicon nitride layer 6, as compared to silicon dioxide. Looking at a leakage current density of $10^{-6}$ A./cm$^2$, it is apparent from FIGS. 4a and 4b that the effective electric field is approximately doubled over that of silicon dioxide for the above-described structure incorporating yttrium oxide layer 8 overlying silicon nitride layer 6. This translates into a doubled charge storage density for the layered film of the invention over silicon dioxide.

It should further be noted that alternative methods for forming the yttrium oxide layer 8 may be used to obtain the benefits of the invention. For example, yttrium oxide layer 8 may be formed by way of conventional, rather than rapid, thermal oxidation of yttrium metal, for example by heating the structure to a temperature of 700 degrees Celsius in an oxidizing ambient for one hour. A further alternative method for the formation of yttrium oxide layer 8 is deposition of yttrium oxide by way reactive sputtering or chemical vapor deposition of yttrium oxide.

Subsequent to the fabrication of the capacitor as described above, the integrated circuit containing the capacitor may be completed according to conventional methods, to form transistors and other elements, and to make electrical connection thereamong and to bond pads for external connection. Individual circuits are then separated from portions of substrate 2, and external connections made thereto by way of wire bonding, direct bump connection, or the like, as is well known in the art. The individual circuits may then be packaged into a dual-in-line package, a chip carrier, or another type of package. An example of such a package is described in U.S. Pat. No. 4,495,376 issued Jan. 22, 1985 and assigned to Texas Instruments Incorporated.

Figure 5:
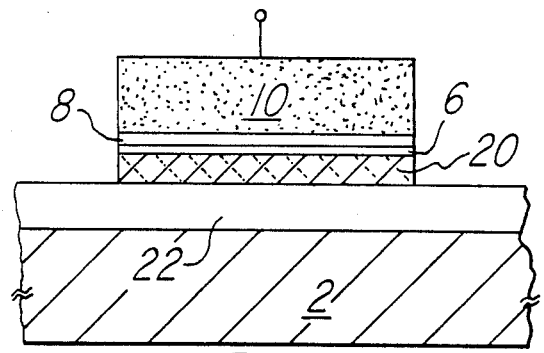
FIG. 5 is a cross-sectional diagram of a capacitor formed according to a second embodiment of the invention, where the lower plate is polysilicon.

Various alternative capacitor structures may also be used which incorporate the dielectric of the invention. For example, the lower plate of the capacitor may be formed by a doped polysilicon layer, as mentioned above and as shown in said U.S. Pat. Nos. 4,577,390 and 4,613,956. An example of such a structure is shown in FIG. 5, having a lower plate of polysilicon 20 disposed over an insulating film 22 at the surface of substrate 2. Silicon nitride layer 6 is disposed over polysilicon layer 20, with yttrium oxide layer 8 disposed thereover as before. The upper plate in this embodiment may be aluminum layer 10 as before. Further in the alternative, the lower plate may either be formed of, or be clad with, a refractory metal silicide for improved conductivity.

A further alternative is to use another conductive material as the upper plate, including the use of other metals such as tungsten and tungsten alloys, compounds such as refractory metal silicides, or a polysilicon layer. The use of such other materials as the upper plate is less preferred, as it is expected that some degradation of the leakage characteristics will occur if the film of the invention including yttrium oxide over silicon nitride is heated (such as in the deposition of polysilicon or the direct react formation of a silicide film), but it is apparent that the presence of the silicon nitride layer 6 will provide reduced degradation than a yttrium oxide film placed directly on silicon or a silicon oxide film as was conventionally practiced.

Figure 6:
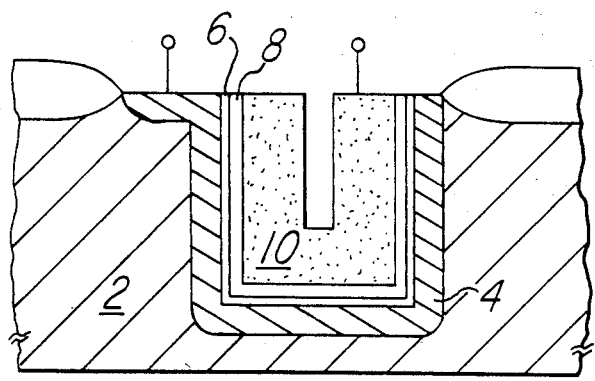
FIG. 6 is a cross-sectional diagram of a capacitor formed according to a third embodiment of the invention, in a recess etched into the substrate.

A further alternative structure is the formation of the capacitor having the dielectric of yttrium oxide overlying silicon nitride in a trench or other recess, either with the bottom plate still in single crystal silicon or in polysilicon. Examples of capacitors formed in trenches and recesses are described in U.S. Pat. No. 4,467,450 issued Aug. 21, 1984 and U.S. Pat. No. 4,651,184 issued Mar. 17, 1987, both assigned to Texas Instruments Incorporated. Referring to FIG. 6, a trench capacitor is shown where the lower plate is region 30 disposed in the sidewalls of a trench etched into substrate 2. Silicon nitride layer 6 and yttrium oxide layer 8 are disposed over lower plate 30 as before, with the upper plate 10 disposed in the trench to complete the capacitor. Further alternatives (not shown) incorporating a trench or recess include a polysilicon lower plate such as shown in FIG. 5 disposed within a trench or recess as shown in FIG. 6, with the layered film and upper plate disposed thereover, and also include a pillar capacitor where an isolation region is disposed at the bottom of the trench, with the capacitor lower plate disposed on the sides of the mesa defined by the trench. It is believed that the layered film of the invention will provide equivalent improvements in such structures as provided in the planar case of FIG. 2.

Although the invention has been described in detail herein with reference to its preferred embodiments and some alternatives thereto, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

We claim:

1. A capacitor for an integrated circuit, comprising:
   a first plate comprising silicon;
   a first dielectric film comprising silicon nitride disposed adjacent to said first plate;
   a second dielectric film comprising yttrium oxide disposed adjacent said first dielectric film and opposing said first plate; and
   a second plate disposed adjacent said second dielectric film and opposing said first plate.

2. The capacitor of claim 1, wherein said first plate comprises single crystal silicon.

3. The capacitor of claim 2, wherein said first plate comprises a sidewall of a a recess etched into a surface of a semiconductor body.

4. The capacitor of claim 1, wherein said capacitor is formed in a recess etched into a surface of a semiconductor body.

5. The capacitor of claim wherein said first plate comprises a polysilicon layer.

6. The capacitor of claim wherein said second plate comprises a metal.

7. The capacitor of claim 6, wherein said metal is aluminum.

8. A capacitor formed at a surface of a semiconductor body, comprising:
   a lower plate comprising silicon dispose near said surface;
   a first dielectric film comprising silicon nitride disposed over said lower plate;
   a second dielectric film comprising yttrium oxide disposed over said first dielectric film; and
   an upper plate disposed over said second dielectric film.

9. The capacitor of claim 8, wherein said first dielectric film is disposed adjacent said lower plate.

10. The capacitor of claim 8, wherein said upper plate is disposed adjacent said second dielectric film.

11. The capacitor of claim 8, wherein said second dielectric film is disposed adjacent said first dielectric film.

12. The capacitor of claim 8, wherein said upper plate comprises a portion of said semiconductor surface.

13. The capacitor of claim 8, wherein said upper plate comprises a layer of polysilicon;
and further comprising an insulating film disposed between said polysilicon layer and said surface of a semiconductor body.

14. The capacitor of claim 8, wherein said upper plate comprises a sidewall of a recess formed at said surface of said semiconductor body.

15. A method for fabricating an integrated circuit, comprising:
forming a first conductive plate near a surface of a semiconductor body;
forming a first dielectric film comprising silicon nitride over said first plate;
forming a second dielectric film comprising yttrium oxide over said first dielectric film; and
forming a second conductive plate over said second dielectric film.

16. The method of claim 15, wherein said step of forming said first conductive plate comprises:
doping a silicon region of said surface of said semiconductor body.

17. The method of claim 15, wherein said step of forming said first conductive plate comprises:
forming a polysilicon layer over said surface of said semiconductor body.

18. The method of claim 15, wherein said step of forming said first dielectric film comprises:
chemical vapor deposition of silicon nitride.

19. The method of claim 15, wherein said step of forming said second dielectric film comprises:
depositing a layer of yttrium metal over said first dielectric film; and
oxidizing said layer of yttrium metal.

20. The method of claim 19, wherein said oxidizing step comprises:
rapid thermal annealing of the semiconductor body in an oxidizing ambient.

21. The method of claim 15, wherein said step of forming said second dielectric film comprises:
depositing a layer of yttrium oxide over said first dielectric film.

22. The method of claim 15, further comprising:
etching a recess into said surface of said semiconductor body, prior to said step of forming said first conductive plate;
wherein said first conductive plate is formed within said recess.

23. The method of claim 15, further comprising:
forming connections between said first and second plates and the external terminals of a package to communicate the charge stored between said first and second plates to said external terminals.

* * * * *